(12) United States Patent
Earle

(10) Patent No.: US 10,878,853 B2
(45) Date of Patent: Dec. 29, 2020

(54) POWER SUPPLY CONTROL

(71) Applicant: Taiwan Semiconductor Manufacturing Company, Ltd., Hsinchu (TW)

(72) Inventor: Adrian Earle, Hsinchu (TW)

(73) Assignee: TAIWAN SEMICONDUCTOR MANUFACTURING COMPANY, LTD.

( * ) Notice: Subject to any disclaimer, the term of this patent is extended or adjusted under 35 U.S.C. 154(b) by 0 days.

(21) Appl. No.: 16/518,256

(22) Filed: Jul. 22, 2019

(65) Prior Publication Data
US 2020/0043531 A1 Feb. 6, 2020

Related U.S. Application Data

(60) Provisional application No. 62/712,706, filed on Jul. 31, 2018.

(51) Int. Cl.
*G11C 5/14* (2006.01)
*G11C 11/417* (2006.01)

(52) U.S. Cl.
CPC ............ *G11C 5/147* (2013.01); *G11C 11/417* (2013.01)

(58) Field of Classification Search
CPC ............................. G11C 5/147; G11C 11/417
USPC ........................................................ 365/226
See application file for complete search history.

(56) References Cited

U.S. PATENT DOCUMENTS 6,452,858 B1 * 9/2002 Hanzawa ................. G11C 8/08
365/226

* cited by examiner

*Primary Examiner* — Huan Hoang
(74) *Attorney, Agent, or Firm* — Merchant & Gould P.C.

(57) ABSTRACT

A memory device includes a controller connected to first, second, third and fourth switches and configured to selectively operate the switches to connect first and second source voltage input terminals to a memory based on a desired current level required for the memory array.

20 Claims, 9 Drawing Sheets

POWER SUPPLY CONTROL

BACKGROUND

Electronic circuits generally require a power supply to operate the circuit. For example, integrated circuit memory devices typically are connected between a source voltage terminal and ground. Some integrated circuit devices, such as memory devices, may be operated at different voltage levels. If, for example, a lower speed or operation level of the device is sufficient at certain times, the device may be operated at a lower voltage level to conserve power. When a faster speed or higher performance is desired, the device may be connected to a high source voltage for higher power operation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
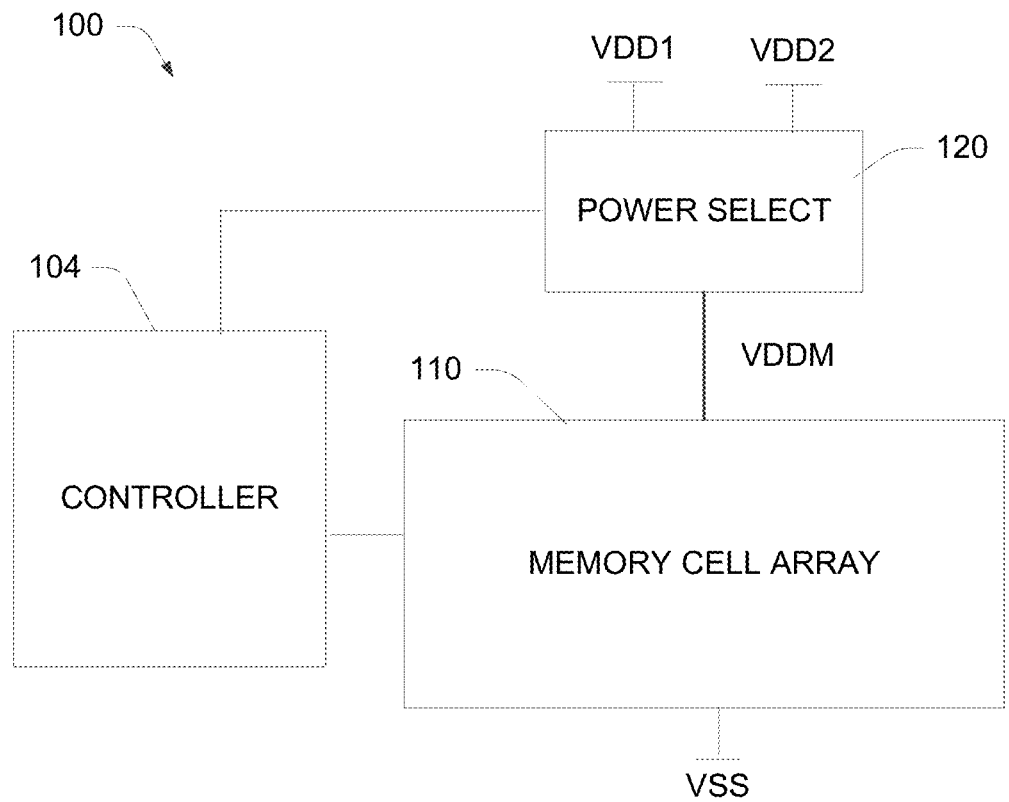
FIG. 1 is a block diagram illustrating aspects of an example static random access memory (SRAM) device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Electronic circuits typically require a power supply to operate the circuit. Some integrated circuit devices are operated at different voltage levels. If, for example, if a lower speed or operation level of the device is sufficient at certain times, the device may be operated at a lower voltage level to conserve power. When a faster speed or higher performance is desired, the device may be connected to a high source voltage for higher power operation.

Some embodiments disclosed herein are disclosed in conjunction with a memory device, such as a volatile random access memory (RAM). Volatile RAM has several uses including as main memory in a processor. There are two kinds of volatile RAM, dynamic and static. Dynamic RAM (DRAM) stores each bit of information in a different capacitor within the integrated circuit. DRAM chips need a single capacitor and one transistor to store each bit of information.

Static RAM (SRAM) is faster than DRAM. A typical SRAM memory device has an array of memory cells. In certain common SRAM arrangements, each memory cell uses six transistors connected between an upper reference potential and a lower reference potential (typically ground) such that one of two storage nodes can be occupied by the information to be stored, with the complementary information stored at the other storage node.

SRAM may be embedded with other computing elements as an alternative to an off-chip memory or stand-alone SRAM. Such embedded SRAM is added to a computer chip as a number of preconfigured SRAM instances. An instance of SRAM is also referred to as an SRAM macro. Each SRAM macro is a collection of static memory elements arranged in rows and columns, and also the associated control circuitry that provides the means to read and write addressable subsets of those memory elements. An SRAM macro typically includes some amount of redundant memory elements that may be used to replace defective memory elements.

Some memory devices, such as SRAM, may be operated at different voltage levels to save power when slower speed or performance is sufficient. For example, an SRAM may be operated at a higher voltage when faster speed and performance is required, or at a lower voltage level when a slower speed is acceptable. Similarly, during periods where accessing the memory is not required, the memory may be operated in a low power a standby or sleep mode to reduce power consumption. Operating the device at a higher voltage than is necessary may waste power.

Some devices essentially disconnect the memory device from one power supply, then reconnect is to another power supply at a different voltage or power level. This can result in a "dead zone" where insufficient power is available to support functionality. Other methods for switching between different source voltages induce a large current that flows from one supply to the other if multiple power sources are simultaneously connected to the device, such as during a switching operation.

In accordance with some disclosed examples, a semiconductor memory such as an SRAM is operated at different power levels. Accordingly, two or more source voltage inputs are provided for connecting the memory device to desired source voltage levels. Some examples provide multiple switches for connecting to the desired voltage supply, where the operation of the switches is sequenced so as to reduce peak currents that flow from one supply to the other, while maintaining sufficient current flow to prevent data loss.

FIG. 1 is a block diagram illustrating an example of a memory device 100 in accordance with aspects of the present disclosure. In the illustrated embodiment of FIG. 1, the memory device 100 includes a memory cell array 110, a power supply control circuit 120, and a memory controller 104. The memory controller 104 may include, among other things, a word line driver discussed further below. In the illustrated embodiment of FIG. 1, each component is shown as a separate block for the purpose of illustration. In certain embodiments, some or all of the components shown in FIG. 1 may be integrated together. For example, the power control circuit 120 may be implemented as part of the memory controller 104. The memory cell array has voltage terminals configured to receive a memory source voltage VDDM, that is connectable to two different source voltages VDD1 and VDD2, thus allowing the memory array 110 to be selectively operated at different voltage levels.

Figure 2:
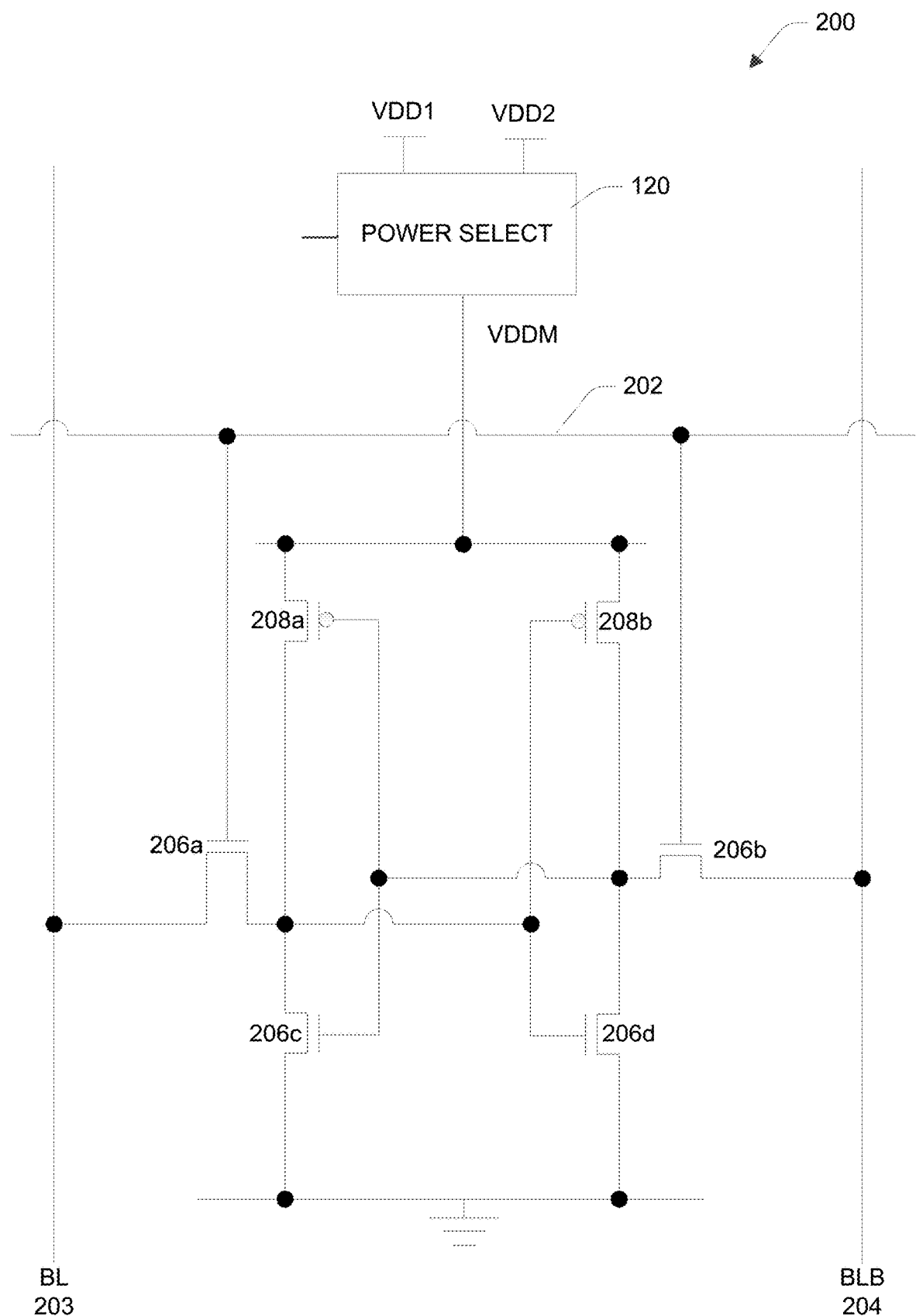
FIG. 2 is a circuit diagram illustrating an example of a static random access memory (SRAM) cell of the memory device shown in FIG. 1 in accordance with some embodiments.

As noted above, in some embodiments the memory array 110 is, for example, an SRAM memory including an array of SRAM memory cells. Other embodiments can include other types of memory as well as other types of circuits. FIG. 2 illustrates an example of an SRAM memory cell 200 of the memory cell array 110 shown in FIG. 1. The memory cell 200 is connected to a word line 202 and complementary bit lines BL 203 and BLB 204. The memory cell 200 includes PMOS transistors 208a-b and NMOS transistors 206a-d. The transistors 208a and 206c are coupled to one another and positioned between the supply voltage VDDM and ground to form an inverter. Similarly, the transistors 208b and 206d are coupled between VDDM and ground to form a second inverter. As will be discussed further below, the VDDM terminal selectively receives the first or second source voltages VDD1 or VDD2 as selected by the power select circuit 120.

The two inverters are cross-coupled to each other. An access transistor 206a connects the output of the first inverter to the bit line BL 203. Similarly, the access transistor 206b connects the output of the second inverter to the bit line bar 204. The word line 202 is attached to the gate controls of the access transistors 206a and 206b to selectively couple the outputs of the inverters to the bit lines 203, 204 during read/write operations in response to the word line driver 104 shown in FIG. 1. During a read operation the inverters drive the complementary voltage levels at the bit lines 203, 204.

The cross coupled inverters of the memory cell 200 provide two stable voltage states denoting logic values 0 and 1. Metal-Oxide Semiconductor Field Effect Transistors (MOSFETs) are typically used as the transistors in the memory cell 200. In some embodiments more or fewer than 6 transistors may be used to implement the memory cell 200. As will be discussed further below, the power select circuit 120 is connected to the VDDM voltage terminal to selectively provide either the VDD1 or VDD2 source voltage to the memory cell 200.

Figure 3:
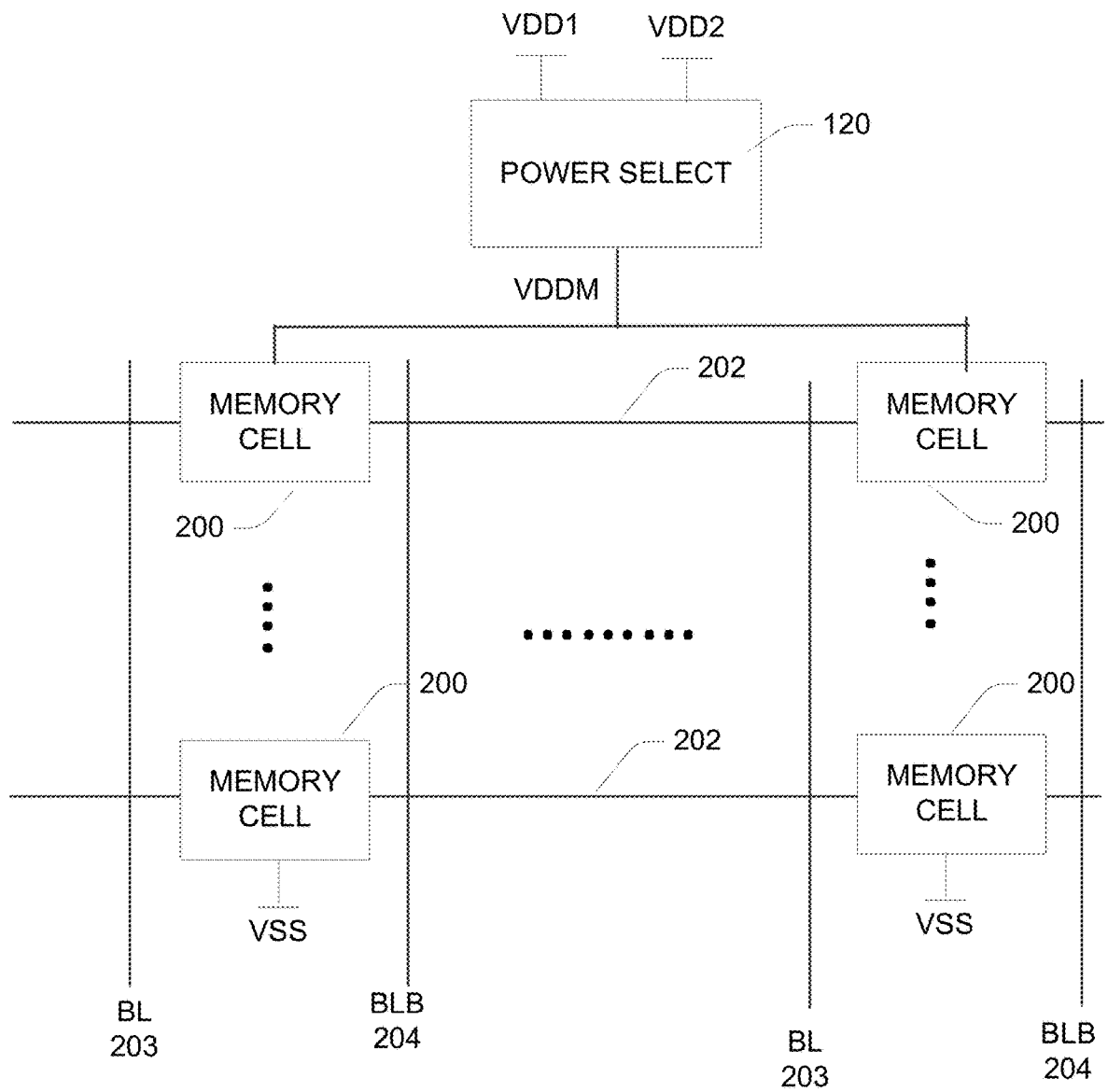
FIG. 3 is a block diagram illustrating further aspects of the memory device shown in FIG. 1 in accordance with some embodiments.

FIG. 3 illustrates further aspects of the memory device 100. In some embodiments, the memory cell array 110 includes a plurality of the memory cells 200 arranged in a column-row configuration in which each column has a bit line 203 and a bit line bar 204, and each row has a word line 202. More specifically, the bit lines 203, 204 of each column are respectively coupled to a plurality of the memory cells 200 that are disposed in that column, and each memory cell 200 in that column is arranged on a different row and coupled to a respective (different) word line 202. That is, each memory cell 200 of the memory cell array 110 is coupled to a bit line 203 of a column of the memory cell array 110, a bit line bar 204 of the column of the memory cell array 110, and a word line 202 of a row of the memory cell array 110. In some embodiments, the bit lines 203 and bit lines bar 204 are arranged in parallel vertically and the word lines 202 are arranged in parallel horizontally (i.e., perpendicular to the bit lines 203, 204. Each of the memory cells 200 is connected to the VDDM and VSS voltage terminals. As noted above, the VDDM source voltage terminal is selectively connectable to the VDD1 or VDD2 source voltage terminals so as to power the memory array of memory cells at a desired power level.

Figure 4:
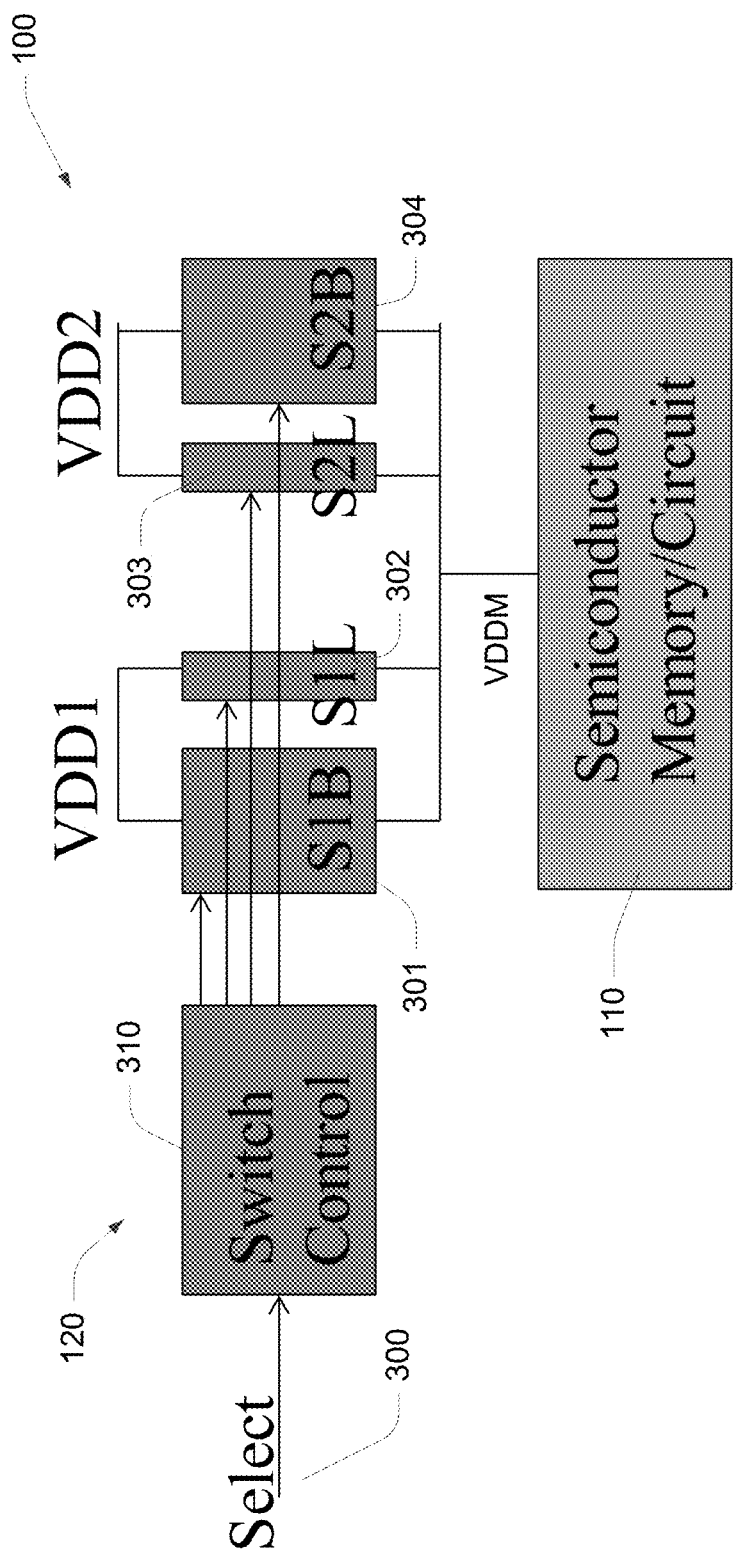
FIG. 4 block diagram illustrating further aspects of the memory device shown in FIG. 1 in accordance with some embodiments.

FIG. 4 illustrates the memory device 100, showing further aspects of an example of the power supply control 120. In the example of FIG. 4, the memory array 110 is connectable to the first and second source voltage input terminals VDD1, VDD2, which receive different source voltage levels such that the memory array 110 can be operated at different source voltage levels as desired.

The voltage output terminal of the power supply control circuit 120 is configured to provide the memory input voltage VDDM to the memory array 110. A first switch 301 and a second switch 302 are connected between the first source voltage input terminal VDD1 and the voltage output terminal VDDM. A third switch 303 and a fourth switch 304 are connected between the second source voltage input terminal VDD2 and the voltage output terminal VDDM. A switch controller 310 receives a voltage level select signal 300, and is connected to the first, second, third and fourth switches 301, 302, 303, 304 to selectively connect the desired first or second source voltage input terminals (VDD1, VDD2) to the voltage output terminal VDDM based on a desired average current level required for the memory array.

For example, the switch controller 310 is configured to operate the switches 301, 302, 303, 304 so as to switch between the first and second voltage supply terminals (VDD1, VDD2) with a minimum peak current level Ipeak. In the embodiments shown in FIG. 4, the first and fourth switches 301, 304 are designated "big" switches S1B, S2B, and the second and third switches 302, 303 are designated "little" switches S1L, S2L. The big switches 301, 304 each have a higher current capacity than the little switches 302, 303. More particularly, in some implementations, the first and fourth big switches (301, 304) are sized for active power needs, while the second and third little switches (302, 303) are sized for leakage needs.

In some disclosed examples, the switch control 310 is operated such that at least one of the little switches 302, 303 is always on. This insures a sufficient source voltage level to maintain memory cell data when the source voltage level is changed from one level to the other—such as VDD1 to VDD2, or VDD2 to VDD1. Thus, the big switch 301 or 304 of the currently connected source voltage terminal is turned off before turning off the little switch 303, or 302 of the currently disconnected source voltage terminal. In this manner, both big switches 301, 304 are never both on, reducing current flow between the voltage two supplies that would occur if both big switches 301, 304 were simultaneously on.

Figure 5:
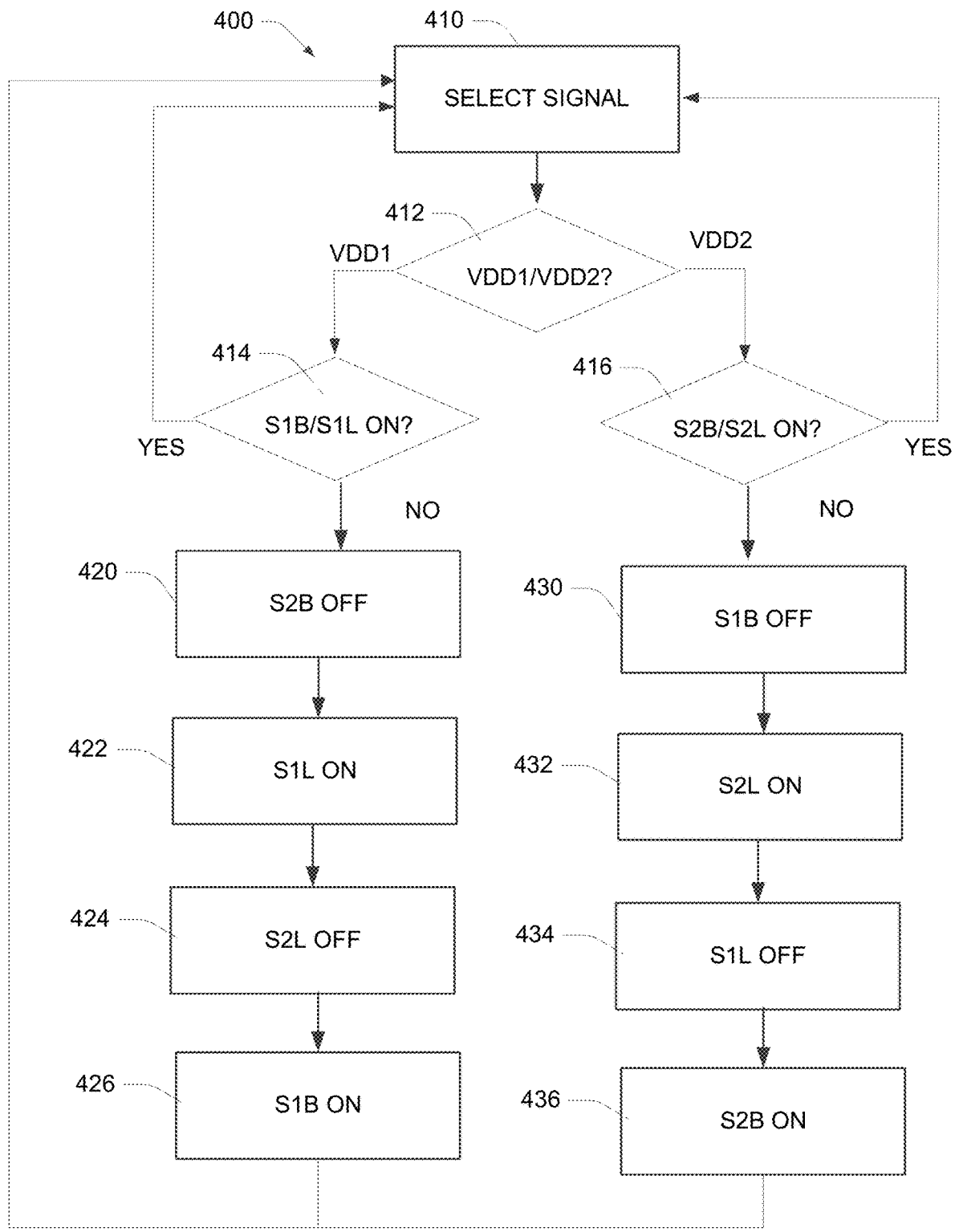
FIG. 5 is a flow diagram illustrating an example of a method in accordance with some embodiments.

FIG. 5 illustrates an example of a power supply operation method 400 implemented by the power select circuit 120. As noted previously, two source voltage terminals VDD1, VDD2 are provided, which allows providing different source voltage levels VDDM for operating the memory array 110. In some examples, the first source voltage terminal VDD1 receives a higher source voltage than the second source voltage terminal VDD2. Thus, the VDD1 source voltage level could be selected for normal operation of the memory array 110, and the VDD2 source voltage level could be selected for a standby mode or slower operation of the memory array 110 to conserve power.

In general, the switches 301, 302, 303, 304 are operated such that the memory voltage terminal VDDM is generally connected to only one source voltage during operation of the memory array 110. When switching between the first and second source voltage terminals VDD1, VDD2, the memory supply input terminal VDDM is temporarily connected to both the first and second source voltages VDD1, VDD2, and thereafter, the memory supply input terminal VDDM is disconnected from one of the source voltage terminals so that the memory supply input terminal VDDM is connected to only one of the source voltage terminals.

More particularly, in block 410 a voltage supply select signal is received by the switch controller 310. The selected voltage level is determined in decision block 412. If the first voltage level VDD1 has been selected, decision block 414 determines if the S1B, S1L switches 301, 302 are currently both on. In other words, decision block 414 determines whether the memory array source voltage VDDM is currently connected to the selected VDD1 source voltage. If this is true, the system returns to operation 410 to receive the next voltage level select signal.

If decision block 414 determines that the S1B, S1L switches 301, 302 are not both on (the memory array source voltage VDDM is not connected to the selected VDD1 voltage level), a process to switch from the VDD2 voltage level to the VDD1 voltage level is executed. Since the S1B, S1L switches 301, 302 are not both on, the memory array source voltage terminal VDDM is currently connected to the VDD2 voltage, i.e., the S2B and S2L switches are both on. In block 420, the S2B switch 304 is turned off. In block 422, the S1L switch 302 is turned on, so that both little switches S1L, S2L are simultaneously on. Since both of the little switches S1L, S2L have a smaller current capacity than the corresponding big switches S1B, S2B, an overly large current peak is not output to the memory array 110. In block 424, the S2L switch 303 is now turned off. Turning on the second switch 302 before turning off the third switch 303 insures that adequate power is maintained to the memory array 110 to prevent data loss. In block 426, the S1B switch 301 is turned on so that both the S1B and S1L switches are on to fully connect the memory array supply terminal VDDM to the VDD1 voltage. The process then restarts at block 410.

Similarly, if the voltage supply select signal 410 and decision block 412 indicate the VDD2 voltage level is selected, decision block 416 determines whether the S2L, S2B switches 303, 304 are both currently both on. In other words, decision block 416 determines whether the memory array source voltage VDDM is already connected to the selected VDD2 source voltage. If this is true, the system returns to operation 410 to receive the next voltage level select signal.

If decision block 416 determines that the S2B, S2L switches 304, 303 are not both on (the memory array source voltage VDDM is not connected to the selected VDD2 voltage level), a process to switch from the VDD1 voltage level to the VDD2 voltage level is executed. Since the S2B, S2L switches 304, 303 are not both on, the memory array source voltage terminal VDDM is currently connected to the VDD1 voltage, and the S1B and S1L switches 301, 302 are both on. In block 430, the S1B switch 301 is turned off. In block 432, the S2L switch is turned on, so that both the little switches S1L, S2L are simultaneously on. In block 434, the switch S1L 302 is now turned off, disconnecting the memory array source voltage VDDM from the VDD1 voltage terminal. Turning on the third switch 303 before turning off the second switch 302 insures that adequate power is supplied to the memory array 110 to prevent data loss. In block 426, the S2B switch 304 is turned on so that both the third and fourth switches 303, 304 are on to fully connect the memory array supply terminal VDDM to the VDD1 voltage. The process then restarts at block 410.

The two little switches S1L 302 and S2L 303 are sized to provide a predetermined minimum current level to support the memory array 110 in a passive mode. More particularly, the little switches (S1L 302, S2L 303) are sized to supply enough current to meet the inactive (or leakage) current of the memory array 110 so that memory data is retained. Switches S1L 302 and S2L 303 may be sized differently from each other as the required current capacity may vary depending on the value of VDD1 and VDD2. The big switches S1B 301 and S2B 304 are sized to provide a predetermined current level to operate the memory array 110 when the circuit is in an active mode, such as when reading from or writing to the memory array 110. Switches S1B 301 and S2B 304 may be sized differently from each other as the required current capacity may vary depending on the value of VDD1 and VDD2. Furthermore the current capacity of some switches may be made programmable or configurable through a variety of circuits as discussed further below.

Figure 6A:
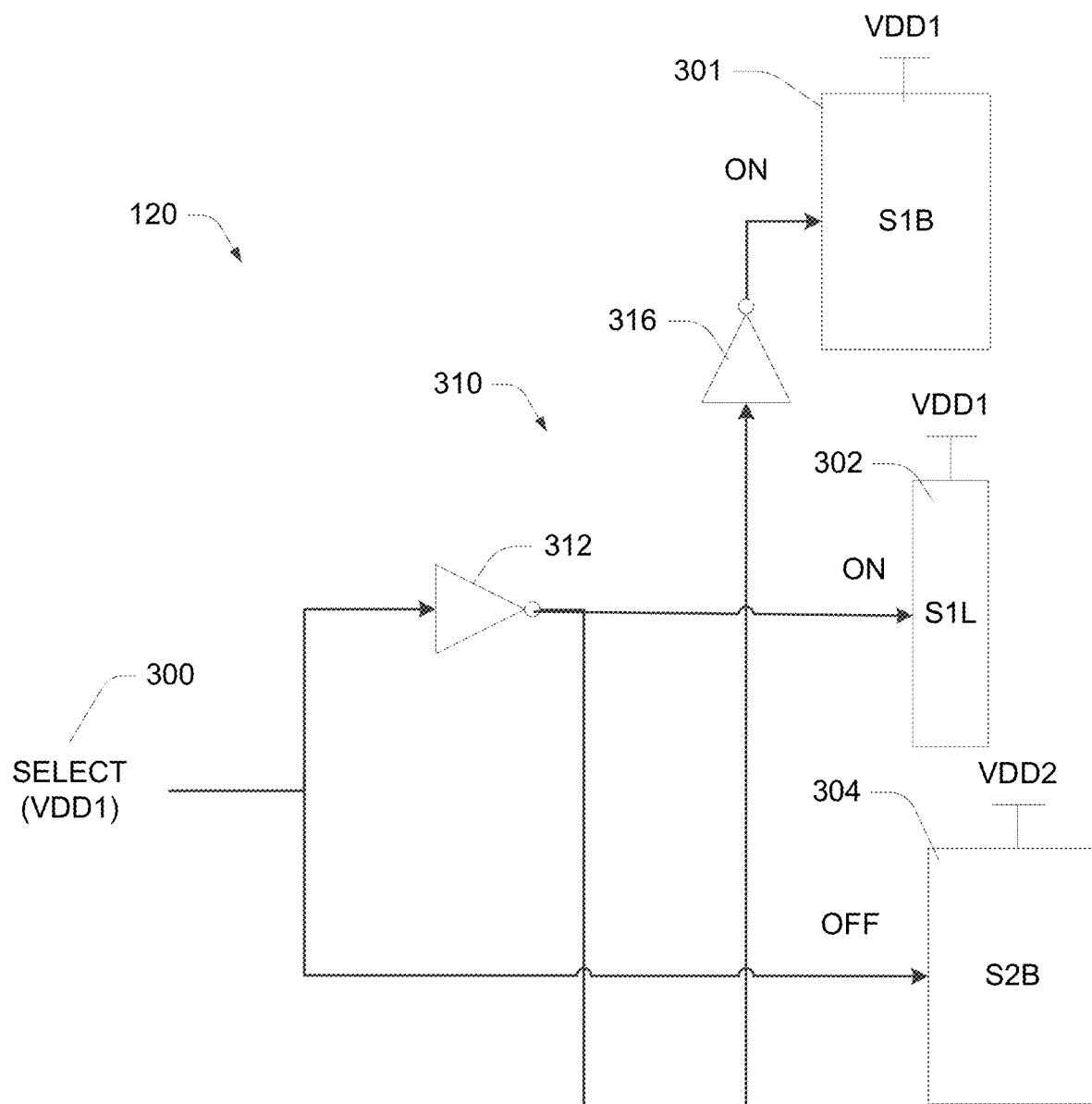
FIG. 6A is a block diagram illustrating aspects of an example of the power select device of the memory device shown in FIG. 1 in accordance with some embodiments.

FIG. 6A is a block diagram illustrating an example of the power select circuit 120. As in the example of FIG. 4, the S1B and S1L switches 301, 302 are both connected to the VDD1 source voltage terminal, and the S2B and S2L switches 304, 303 are both connected to the VDD2 source voltage terminal. As noted above, the switch control 310 is operated such that at least one of the little switches 302, 303 is on to insure a sufficient source voltage level to maintain memory cell data when the source voltage level is changed from one level to the other. Thus, when switching from the VDD2 voltage to the VDD1 voltage level, the S2B switch 304 is turned off before turning on the S1L switch 302 and turning off the S2L switch 303.

In the illustrated example, the select signal 300 is set to switch the VDDM voltage terminal from the VDD2 voltage level to the VDD1 voltage level. Thus, as shown in operation 420 of FIG. 5, S2B switch 304 is first turned off by directly providing the select signal 300 to the S2B switch 304 to turn the switch off. The S1L switch 302 is then turned on, so that both the little switches 302, 303 are on. The select signal 300 is thus applied to the S1L switch 302 through a delay device to achieve the desired timing for operation of the S1L switch 302. In FIG. 6, the delay device is an inverter 312, which is configured to both invert the signal 300 to turn the S1L switch on, and further configured to delay application of the inverted signal to the S1L switch such that the S1L switch 302 is not turned on until after the big switch S2B 304 is turned off. In other implementations, additional inverters and/or other logic devices may be employed to achieve the desired delay and signal logic levels. Turning off the S2B switch 304 before fully changing to the VDD1 power supply prevents a current surge at the VDDM terminal coupled to the memory array 110.

At this point, both little switches 302, 303 are on to insure a desired minimum current level is provided, for example, to maintain data stored by the memory cells 200. The S2L switch 303 is then turned off by applying the inverted select signal 300 to the S2L switch 303 through a second inverter 314. The inverter 314 is configured to invert the signal 300 to turn the S2L 303 switch off, and also to further to delay application of the control signal to the S2L switch 303 so that the S2L 303 switch is not turned off before the S1L switch 302 is turned on. Only the S1L switch 302 is now on, maintaining at least a minimum current level supplied to the VDDM terminal for the memory array 110.

As indicated in block 426 of FIG. 5, the S1B switch 301 may now be turned on to fully connect the memory array 110 to the VDD1 voltage terminal. Thus, the select signal 300 is applied to the S1B switch 301 through a third inverter 316 to invert the select signal 300 and further delay its application to the S1B switch 301, insuring that the S1B switch 301 is not turned on before the S2L switch is turned off. The memory array 110 is now fully connected to the VDD1 source voltage terminal.

Additionally in some embodiments the delay elements (312, 314, 316) may be comprised of other components, such as logic gates (NAND/NOR), wire delays (resistance and capacitance) and/or a combination of the aforementioned elements.

Figure 6B:
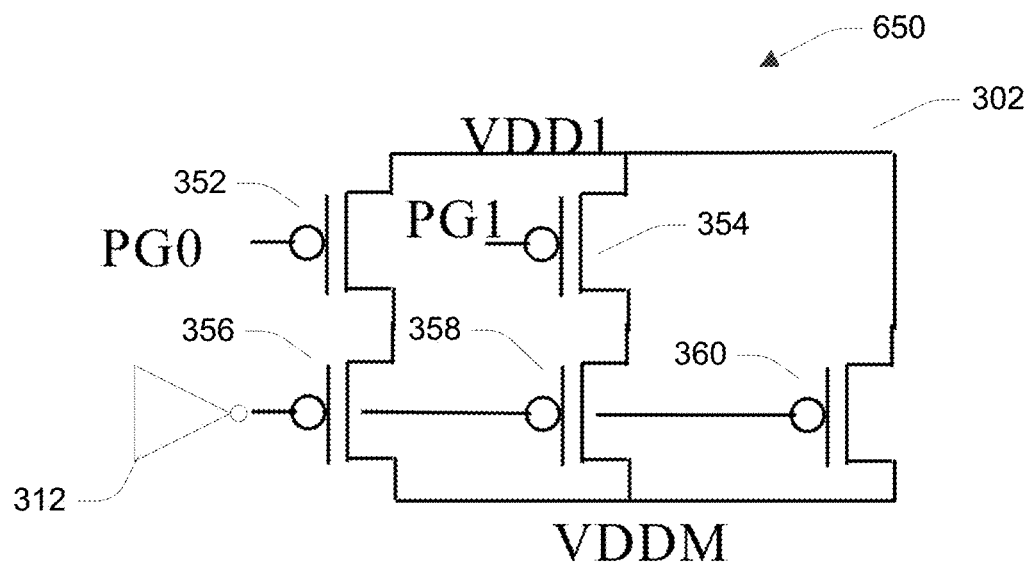
FIG. 6B is circuit diagram illustrating a programmable switch usable in the power select device of FIG. 6A in accordance with some embodiments.

FIG. 6B shows an example of a programmable switch 650 that may be implemented in the memory device 100 power supply control 120. This example depicts a programmable switch that could be implemented as any of the switches 301, 302, 303, 304 between VDD1 and VDDM. The example of FIG. 6B illustrates the switch 302 receiving the select signal 300 via the inverter 312. Signals PG0 and/or PG1 may be applied to the gates of respective transistors 352, 354 as desired to vary the number of current paths available, thus varying the current capacity of the switch. For instance, signals PG0 and PG1 may both be brought low to activate the respective PMOS transistors 352 and 354 providing three current branches between VDD1 and VDDM to add additional current capacity to the switch. When the output of the inverter 312 goes low transistors 356, 358 and 360 are all active to provide maximum current capacity. If a minimal amount of current is required, signals PG0 and PG1 can be kept high, turning off transistors 352 and 354, and allowing current to flow only through only the rightmost branch through the transistor 360. Additionally, for example, a single signal such as PG1 could be brought low while PG0 is kept high in order to activate transistor 354 but not activate transistor 352 and the leftmost branch. This provides two branches for current flow.

Figure 7:
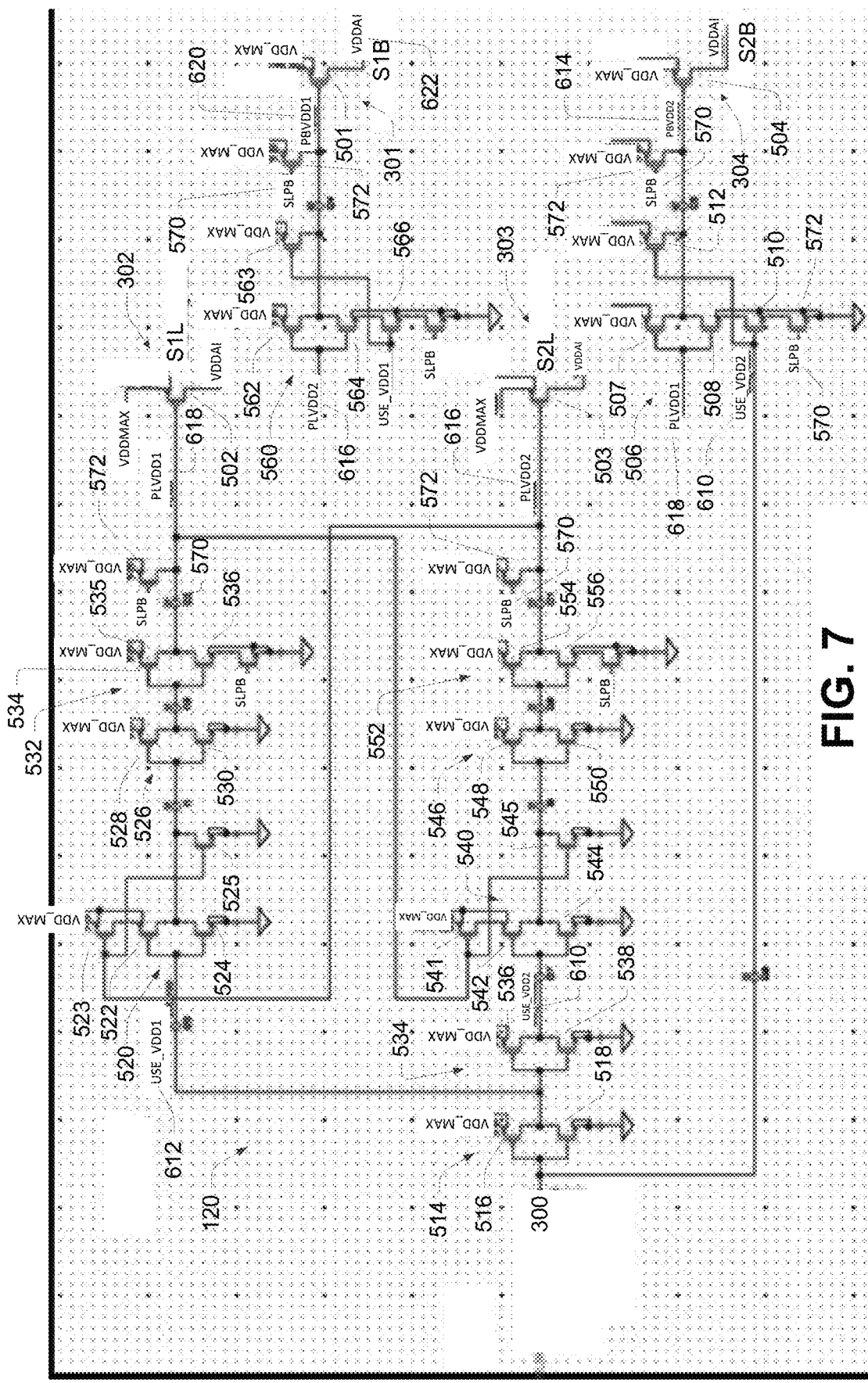
FIG. 7 is a circuit diagram illustrating further aspects of the example of the power select device shown in FIG. 6A in accordance with some embodiments.
Figure 8:
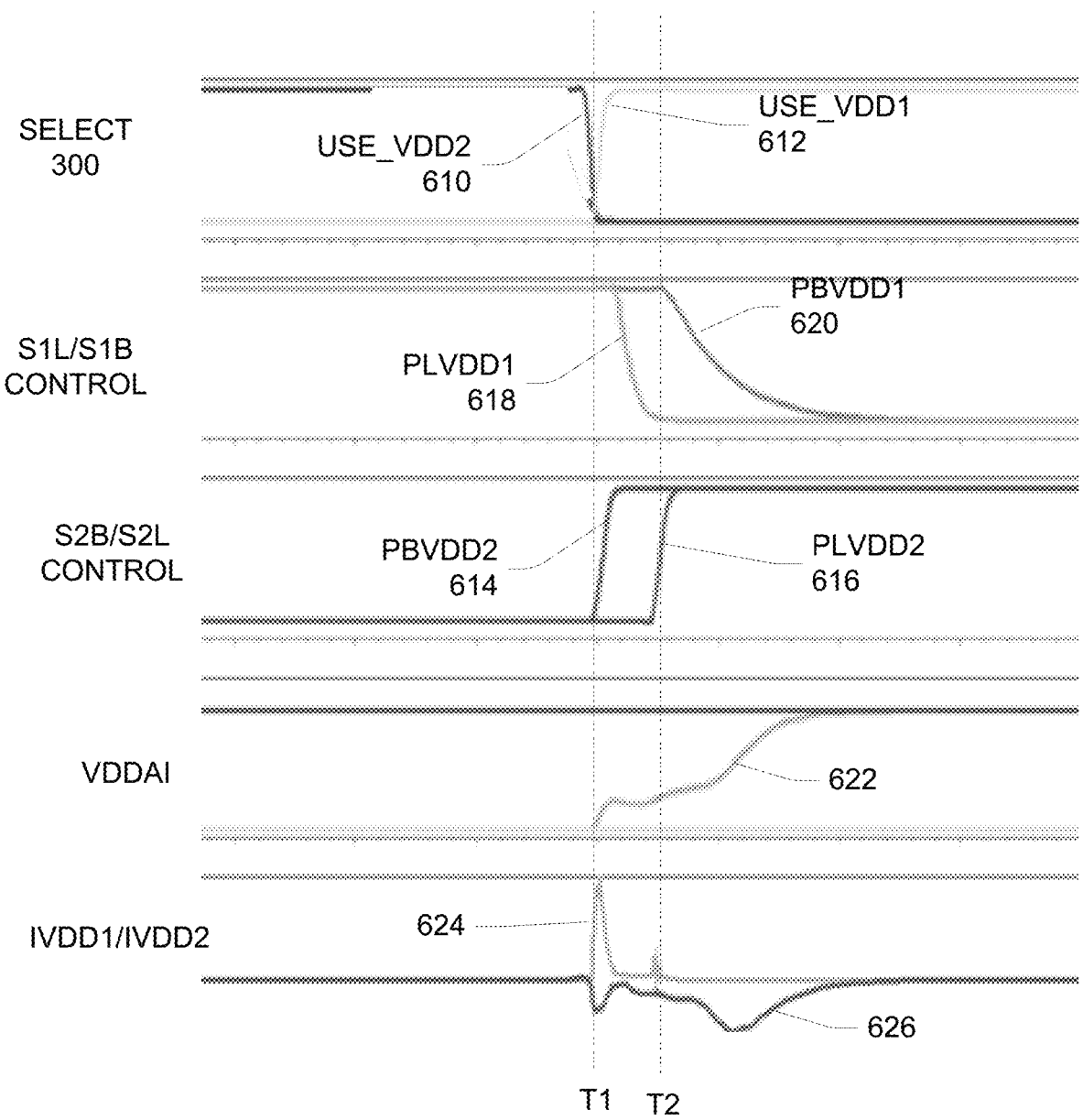
FIG. 8 is a timing diagram illustrating examples of wave forms of the power select device shown in FIG. 7 in accordance with some embodiments.

FIG. 7 is a circuit diagram illustrating an example implementation of the power select circuit 120. FIG. 8 illustrates examples of waveforms corresponding to various signals in the power select circuit 120 shown in FIG. 7. In some embodiments, the second voltage level VDD2 ranges from about 0.6 to 1.0 volts, while the first voltage level VDD1 ranges from about 0.4 to 0.8 volts. In some embodiments, the two voltage levels differ by at least about 0.2 volts, depending on the particular application. The S1B switch 301, S1L switch 302, S2L switch 303, and S2B switch 304 are implemented by PMOS transistors 501, 502, 503, 504, respectively. Since an active high signal at the gates of the PMOS transistors turns the respective transistors off, the transistors are operated by a voltage designated VDD_MAX, which is the higher of the VDD1 and VDD2 voltage levels to insure the transistors turn off when desired. Using VDD_MAX to turn off the switches ensures that the leakage through the off switch is minimized by setting the gate voltage at least as high as the source voltage.

Referring now to FIG. 7 and the wave forms shown in FIG. 8, the select signal 300 is set to switch the VDDM voltage terminal from the VDD2 voltage level to the VDD1 voltage level. The voltage select signal 300 includes a USE_VDD2 signal 610 and a USE_VDD1 signal 612. In the example shown in FIG. 7 and FIG. 8, the voltage supply is being switched from the VDD2 voltage level to the VDD1 voltage level. Thus, at a first time T1 in FIG. 8 the USE_VDD2 signal 610 goes low. The low USE_VDD2 signal 610 is applied to the gate terminal of an NMOS transistor 510 and the gate terminal of a PMOS transistor 512, which are components of a two input NAND gate 506 that further includes PMOS transistors 507 and NMOS transistor 508. The low USE_VDD2 signal 610 turns the NMOS transistor 510 off and the PMOS transistor 512 on, pulling the S2B switch control signal PBVDD2 614 high, turning the S2B switch 304 off.

The low USE_VDD2 signal 610 of the voltage select signal 300 is further received by an inverter 514 made up of a PMOS transistor 516 and an NMOS transistor 518. The inverted USE_VDD2 select signal 300 becomes the USE_VDD1 signal 612, which goes high as shown in FIG. 8 since the VDDM voltage level is being switched from the VDD2 level to the VDD1 level. The high USE_VDD1 signal 612 is received by one input of a two input NOR gate 520, which includes PMOS transistors 522 and 523, and NMOS transistors 524 and 525. The NOR gate 520 is followed by two delay elements, inverters 526 and 532 each of which includes a respective PMOS transistor 528 and 535, and NMOS transistor 530 and 536. The high USE_VDD1 signal results in the S1L switch control signal PLVDD1 618 output by the NOR gate 520 going low, turning on the S1L switch 302 (PMOS transistor 502). Thus, the S1L switch 302 (transistor 502) and the S2L switch 303 (transistor 503) are currently on. The low S1L switch control signal PLVDD1 618 is also received at the second input of the NAND gate 506 to latch the PBVDD2 signal 614.

As shown in FIG. 8, the voltage output signal VDDAI 622 at the memory array input terminal VDDM begins to transition from the VDD2 level to the VDD1 level. The VDD2 current signal 624 and the VDD1 current signal 626 show some current flow between the two voltage terminals VDD2 and VDD1, though the little switches S1L 302, S2L 303 (PMOS transistors 502, 503) are sized to minimize the current flow between the voltage terminals and maintain the current flow between the two voltage terminals below a predetermined maximum current level when the switches are both on. In the example shown in FIG. 7 and FIG. 8, the switches are configured to keep current flow between the VDD1 and VDD2 terminals below 250.0 microamps.

The USE_VDD1 signal 612 is also received by a delay element, inverter 534, and the inverted USE_VDD1 signal 612 (i.e. USE_VDD2) is received at one input of a NOR gate 540, which includes PMOS transistors 541 and 542, and NMOS transistors 544 and 545. The NOR gate 540 is followed by two delay elements, inverters 546, and 552, each of which includes a respective PMOS transistor 548 and 554 and NMOS transistor 550 and 556. The low S1L switch control signal PLVDD1 618 is received at the other input of the NOR gate 540. The low USE_VDD2 and PLVDD1 signals received by the NOR gate 540 result in the S2L switch control signal PLVDD2 616 going high at a time T2 to turn the S2L switch 503 (PMOS transistor 503) off. The inverters 546, 552 provide the desired signal delay such that the PLVDD2 signal 616 turns the S2L switch 303 off in the desired sequence. The PLVDD2 signal 616 is also fed back to the NOR gate 520 to latch the PLVDD1 signal 618.

The PLVDD2 signal 616 is additionally received by a NAND gate 560 made up of PMOS transistors 562, 563 and NMOS transistors 564, 566. The other input of the NAND gate receives the high USE_VDD1 select signal. The high PLVDD2 control signal results in a low PLVDD1 signal 620 being applied to the S1B switch 301 (PMOS transistor 501) to turn the switch on, fully transitioning the supply voltage from the VDD2 voltage to the VDD1 voltage as shown by the VDDAI signal 622 in FIG. 8. In the example of FIG. 7, the delay elements are inverters, NAND gates and NOR gates. However, in other implementations, the desired signal delay may be accomplished in other ways. For example, the S1B, S1L, S2L, S2B switches (transistors 501, 502, 503, 504) may be geographically separated on the device in place of, or in combination with other delay elements such as the logic gates to achieve the desired signal timing. Further, the control signals for controlling the S1B, S1L, S2L, S2B switches (transistors 501, 502, 503, 504) could be accomplished using devices other than logic gates.

The particular example shown in FIG. 7 further includes a SLPB control signal to select a sleep state for the SRAM memory array 110. The SLPB control signal 570 is received by sleep mode control transistors 572 at various locations in the illustrated control circuit turn off each of the S1B, S1L, S2L, and S2B switches (transistors 501, 502, 503, 504) to selectively place the SRAM memory array 110 in a low power sleep mode.

Further, in the example of FIG. 7 the little switches S1L 302 and S2L 303 are sized to support the leakage at the maximum leakage current, while the S1B 301 and S2B 304 big switches are sized to support active operation of the memory array 110 at the worst case active current level. Thus, the S1B 301 and S2B 304 big switches are sized to provide the current level required for active mode operation of the memory array 110. In implementations such as the example of FIG. 7 where MOS transistors are employed, the relative sizes of the big and little switches are defined by width and length parameters of the MOS devices. For instance, a wider device allows more current flow. The width and length parameters may be selected such that the MOS devices have sufficient drive strength to supply the desired current and leakage levels.

Thus, as shown in FIG. 8, the current flowing between the VDD2 and VDD1 voltage supplies when both switches are on is greatly reduced. Further, sufficient power is provided to maintain data during the process of switching from one supply voltage to the other.

Accordingly, disclosed embodiments include a memory device that includes a memory array with a plurality of memory cells. A power supply control includes a first source voltage input terminal configured to receive a first source voltage, a second source voltage input terminal configured to receive a second source voltage, and a voltage output terminal configured to provide a memory input voltage to the memory array. First and second switches are connected between the first source voltage input terminal and the voltage output terminal. Third and fourth switches are connected between the second source voltage input terminal and the voltage output terminal. A controller is connected to the first, second, third and fourth switches and is configured to selectively operate the switches to connect the first and second source voltage input terminals to the voltage output terminal based on a desired current level required for the memory array.

In accordance with still further disclosed embodiments, a power supply control circuit includes a first source voltage input terminal configured to receive a first source voltage, a second source voltage input terminal configured to receive a second source voltage, and a voltage output terminal. First and second switches are connected between the first source voltage input terminal and the voltage output terminal. Third and fourth switches are connected between the second source voltage input terminal and the voltage output terminal. A controller is connected to the first, second, third and fourth switches and is configured to selectively connect the first and second source voltage input terminals to the output terminal in a predetermined switching sequence in which the first and second switches are initially on, the third and fourth switches are off, the second and third switches are both on, the first and fourth switches are off, and thereafter the third and fourth switches are on and the first and second switches are off.

In accordance other disclosed aspects, a method of operating power supply for a memory device includes connecting a memory supply voltage input terminal to only a first source voltage, connecting the memory supply input voltage terminal to both the first source voltage and a second source voltage. Thereafter, the memory supply input voltage terminal is disconnected from the first source voltage so that the memory supply input voltage terminal is connected to only the second source voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a memory array including a plurality of memory cells;
   a power supply control including:
   a first source voltage input terminal configured to receive a first source voltage;
   a second source voltage input terminal configured to receive a second source voltage;
   a voltage output terminal configured to provide a memory input voltage to the memory array;
   first and second switches connected between the first source voltage input terminal and the voltage output terminal, wherein the first switch has a first current capacity, and the second switch has a second current capacity smaller than the first current capacity;
   third and fourth switches connected between the second source voltage input terminal and the voltage output terminal; and
   a controller connected to the first, second, third and fourth switches and configured to selectively operate the switches to connect the first and second source voltage input terminals to the voltage output terminal based on a desired current level required for the memory array.

2. The memory device of claim 1, wherein the fourth switch has a first current capacity, and the third switch has a second current capacity smaller than the first current capacity.

3. The memory device of claim 1, wherein the second and third switches are sized to support a desired leakage level at a maximum leakage current of the memory array.

4. The memory device of claim 1, wherein when in operation at least one of the second and third switches is always on.

5. The memory device of claim 1, wherein when in operation the first and fourth switches are never simultaneously on.

6. The memory device of claim 1, further comprising a plurality of signal delay devices connected between the controller and the second, third, and fourth switches.

7. The memory device of claim 6, wherein the delay elements include inverters.

8. The memory device of claim 7, wherein the inverters each include an NMOS and a PMOS transistor.

9. The memory device of claim 1, wherein the controller is configured to selectively connect the first and second source voltage input terminals to the output terminal in a predetermined switching sequence in which:
the first and second switches are on, and the third and fourth switches are off;
the second and third switches are on, and the first and fourth switches are off;
the third and fourth switches are on, and the first and second switches are off.

10. The memory device of claim 1, wherein the plurality of memory cells include a plurality of volatile memory cells.

11. The memory device of claim 10, wherein the plurality of volatile memory cells include SRAM memory cells.

12. A power supply control circuit, comprising:
a first source voltage input terminal configured to receive a first source voltage;
a second source voltage input terminal configured to receive a second source voltage;
a voltage output terminal;
first and second switches connected between the first source voltage input terminal and the voltage output terminal;
third and fourth switches connected between the second source voltage input terminal and the voltage output terminal;
a controller connected to the first, second, third and fourth switches and configured to selectively connect the first and second source voltage input terminals to the output terminal in a predetermined switching sequence in which:
the first and second switches are on, and the third and fourth switches are off;
the second and third switches are on, and the first and fourth switches are off;
the third and fourth switches are on, and the first and second switches are off.

13. The power supply control circuit of claim 12, wherein the controller is configured to selectively connect the first and second source voltage input terminals to the voltage output terminal based on a desired current level required for the memory array.

14. The power supply control circuit of claim 12, wherein the first and fourth switches have a first similar current capacity, and the second and third switches have a second similar current capacity smaller than the first current capacity.

15. The power supply control circuit of claim 12, wherein the second and third switches are sized to support a desired leakage level at a maximum leakage current of the memory array.

16. The power supply control circuit of claim 12, wherein the first and fourth switches are sized to support a worst case current level during operations of the memory array.

17. A method of operating power supply for a memory device, comprising:
providing a first source voltage at a first voltage level;
providing a second source voltage at a second voltage level;
providing a memory array including a plurality of memory cells, the memory array having a memory supply voltage input terminal;
connecting the memory supply voltage input terminal to only the first source voltage;
connecting the memory supply input voltage terminal to both the first and second source voltages, including maintaining a current flow between the first and second source voltages below a predetermined maximum current level;
disconnecting the memory supply input voltage terminal from the first source voltage so that the memory supply input voltage terminal is connected to only the second source voltage.

18. The method of claim 17, further comprising:
providing first and second switches connected between the first source voltage and the memory supply voltage input terminal;
providing third and fourth switches connected between the second source voltage and the memory supply voltage input terminal;
wherein connecting the memory supply voltage input terminal to only the first source voltage includes turning off the third and fourth switches and turning on the first and second switches;
wherein connecting the memory supply voltage input terminal to both the first and second source voltages includes turning off the first switch and turning on the third switch such that the second and third switches are on; and
wherein disconnecting the memory supply voltage input terminal from the first source voltage includes turning off the second switch and turning on the fourth switch.

19. The method of claim 18, wherein when in operation at least one of the second and third switches is always on.

20. The method of claim 18, further comprising sizing the second switch and the third switch to support a desired leakage level at a maximum leakage current of the memory array.

* * * * *